United States Patent
Lai (10) Patent No.: US 6,638,869 B2
(45) Date of Patent: Oct. 28, 2003

(54) PROCESS FOR MANUFACTURING REFLECTIVE TFT-LCD WITH ROUGH DIFFUSER

(75) Inventor: Han-Chung Lai, Jung Li (TW)

(73) Assignee: AU Optronics Corp., Hsinchu (TW)

( * ) Notice: Subject to any disclaimer, the term of this patent is extended or adjusted under 35 U.S.C. 154(b) by 52 days.

(21) Appl. No.: 09/984,693

(22) Filed: Oct. 31, 2001

(65) Prior Publication Data

US 2002/0115297 A1 Aug. 22, 2002

(30) Foreign Application Priority Data

Feb. 21, 2001 (TW) .......................... 90103954 A (51) Int. Cl.[7] .............................................. H01L 21/302
(52) U.S. Cl. ...................... 438/694; 438/702; 438/706; 438/719; 438/720; 438/723
(58) Field of Search ................................ 438/694, 702, 438/706, 719, 720, 723, 724

(56) References Cited

U.S. PATENT DOCUMENTS 6,226,060 B1 * 5/2001 Onisawa et al. ............. 349/43
6,433,842 B1 * 8/2002 Kaneko et al. ............... 349/43
6,441,399 B1 * 8/2002 Koyama et al. ............... 257/59

* cited by examiner

Primary Examiner—Benjamin L. Utech
Assistant Examiner—Binh X. Tran
(74) Attorney, Agent, or Firm—Troxell Law Office PLLC (57) ABSTRACT

A method of forming a TFT-LCD device with a rough pixel electrode. The method includes the following steps. A first metal layer is formed on a substrate. A first etching procedure is performed to etch the first metal layer to define a gate structure. A first insulating layer is formed on the gate structure and the substrate. A semiconductor layer is formed on the first insulating layer above the gate structure. A second metal layer is formed on the first insulating layer and the semiconductor layer. A second etching procedure is performed to etch the second metal layer to define drain/source structures. A passivation layer is formed on the drain/source structures. A pixel electrode, having a rough surface caused by at least one set of bumps formed above the substrate, is formed on the passivation layer to electrically connect the source structure.

13 Claims, 7 Drawing Sheets

PROCESS FOR MANUFACTURING REFLECTIVE TFT-LCD WITH ROUGH DIFFUSER

FIELD OF THE INVENTION

The present invention relates to a process for manufacturing TFT liquid crystal displays and, more specifically, to a process for manufacturing pixel electrodes with rough diffusers for serving as the reflection members of TFT-LCD devices.

BACKGROUND OF THE INVENTION

With the advance of techniques for manufacturing thin-film transistors, the liquid crystal displays (LCD) are widely applied in electrical products, such as PDAs, laptops, cellphones, high resolution television sets, etc. due to advantages as smaller size, portability, and lower power consumption. Particularly the up-to-date reflective LCD device is usually performed by utilizing the reflection of light incident from outside, wherein the pixel electrodes made of metal materials are applied to serve as reflection members. Thus the light reflected form the pixel electrode performs desired images on the displays through liquid crystal molecules and color filters. The reflective type liquid crystal display which does not require a backlight has been vigorously developed because this type of display is power saving, thin and lightweight. In addition, since members for the backlight are not necessary, the cost may be reduced.

Notedly, the deeply concerned and important key point is how to promote efficiency of light reflection because the light source of the reflective type LCD comes from the external illumination. In prior art, polarizing plates are introduced to adjust the phases of incident lights for increasing reflection intensity. However, it is not practical to apply the additional polarizing plates into the reflective type LCD. Another solution is to fabricate the pixel electrodes with rough surface for serving as the reflection diffusers for completely utilizing external illuminations, promoting efficiency of reflections and increasing contrasts.

Figure 1:
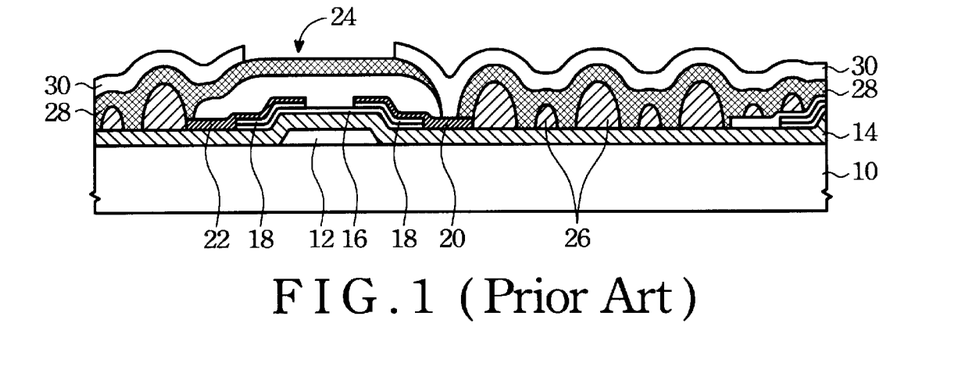
FIG. 1 is a cross sectional view of a transparent substrate illustrating the TFT-LCD device which have rough reflection members in accordance with the prior art.

Please refer to FIG. 1, the cross-sectional view of TFT-LCD with rough reflection fabricated by prior art is shown. The related process comprises follow steps. A gate structure 12 is defined on a glass substrate 10 first. Then an insulating layer 14 is deposited on surfaces of the gate structure 12. A semiconductor layer 16 such as amorphous silicon, a doped silicon layer 18 and a metal layer are sequentially formed on the gate structure 12. Next a photolithography procedure is performed to define a drain structure 20 and a source structure 22. After the TFT-LCD 24 is fabricated, an additional step is performed to form plural bumps 26 made of photoresists in the areas for defining pixel electrodes. Next a passivation layer 28 such as polymer material is coating on the bumps 26. And a pixel electrode 30 is formed above those layers. Thus, the reflection efficiency is promoted due to the pixel electrode 30 having a rough and uneven surface.

However, for forming the bumps 26, it is necessary to deposit a photoresist layer on the glass substrate 10 first, and to perform the lithography, developing, and baking steps for defining bump patterns. It is required to fabricate an additional reticle for performing the above procedures. Therefore the cycle time is prolonged and the throughput is reduced cause the additional photomask and related steps. Additionally, the procedures of defining bumps 26 usually damage the glass substrate and devices because the thin-film transistor 24, scan lines, data lines, and capacitors are formed before those steps of defining bumps 26.

SUMMARY OF THE INVENTION

The first objective of the present invention is to provide a method for manufacturing a TFT-LCD device having pixel electrodes with rough surfaces for serving as reflection members.

The second objective of the present invention is to provide a method of forming pixel electrodes with rough surfaces, wherein three different types of bumps are mutually stacked arbitrarily to make surfaces of the pixel electrodes rough and uneven.

The third objective of the present invention is to provide a method of defining bumps below pixel electrodes for making the pixel electrodes have rising and falling surfaces without additional lithography etching procedure.

The four objective of the present invention is to provide a process for manufacturing TFT-LCDs with rough reflections, wherein various bumps for making the reflection members have rough surfaces are formed in the steps of defining patterns of the thin-film transistors simultaneously.

A method of forming a TFT-LCD device with a rough pixel electrode for serving as the diffuser member is disclosed hereinafter. The method comprises the following steps. First, a first metal layer is formed on a substrate. And a first etching procedure is done to etch the first metal layer for defining a gate structure. Then a first insulating layer is formed on the gate structure and the substrate. A semiconductor layer is formed on the first insulating layer above the gate structure. Next a second insulating layer is deposited on the semiconductor layer and the first insulating layer. A second etching procedure is done to etch the second insulating layer to define an etching stopper above the gate structure. Subsequently a second metal layer is formed thereon and a third etching procedure is done then to etch the second metal layer to define drain/source structures aside the etching stopper. Next a passivation layer is formed on the drain/source structures and the first insulating layer, wherein the passivation layer is etched to expose a portion of the drain/source structures. A pixel electrode is then formed on the passivation layer wherein the pixel electrode is electrically connected to the drain/source structures.

It is noted that the pixel electrode have the rough surface duplicated from at least one sort of bumps defined above the substrate. The bumps comprise first bumps, second bumps, and third bumps, wherein the first bumps are made of the first metal layer and defined in the first etching procedure simultaneously, the second bumps are made of the second insulating layer and defined in the second etching procedure simultaneously, and the third bumps are made of the second metal layer and defined in the third etching procedure simultaneously.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed hereinafter to manufacture the TFT-LCD devices with pixel electrodes that are served as diffusers. The plural various bumps are formed in the areas for defining the pixel electrodes simultaneously in the procedures of defining the various patterns for forming the thin-film transistor. Thus the pixel electrodes can duplicate the uneven surface from the below bumps. And the rough and uneven shapes of the pixel electrodes can be adjusted by arranging and stacking different bumps arbitrarily. The detailed description is given as following.

Figure 2:
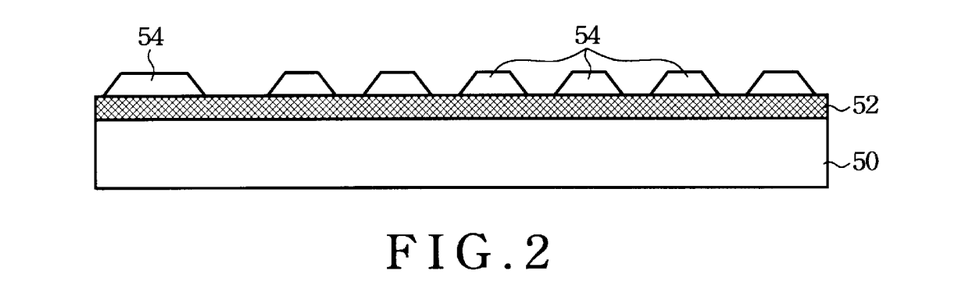
FIG. 2 is a cross sectional view of a transparent substrate illustrating the step of forming the first metal layer on the substrate in accordance with the present invention.

The First Embodiment:

Refer to FIG. 2, in the first embodiment of the present invention a first metal layer 52 is formed on a transparent insulator substrate 50 by performing a PVD procedure such as sputtering. The substrate 50 is preferably made of a glass, quartz, or the likes. And the first metal layer 52 can be chosen from the group of aluminum(Al), titanium(Ti), chromium(Cr), tungsten(W), tantalum(Ta), alloy and any combination thereof. Then plural photoresist bumps 54 are defined on the first metal layer 52 by coating the photoresist material onto the first metal layer 52 and then performing lithography steps.

Figure 3:
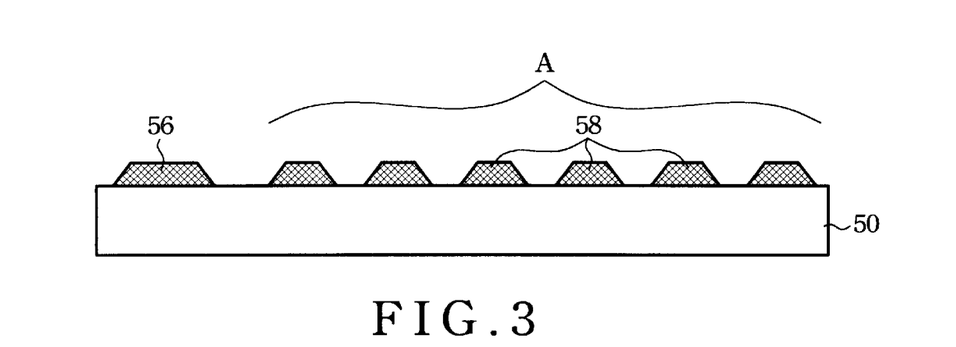
FIG. 3 is a cross sectional view of a transparent substrate illustrating the step of defining the gate structure and the plural first bumps in accordance with the present invention.

Then a first etching procedure is performed to etch the first metal layer 52 for defining a gate structure 56 and plural first bumps 58 simultaneously on the substrate 50 by applying the photoresist bumps 54 for etching masks as shown in FIG. 3. Notedly the first bumps 58 are defined in the area A where are predetermined to fabricate pixel electrodes later. As well known, capacitor storage electrodes, data lines and scan lines (all not illustrated) are defined on the substrate 50 simultaneously when the first etching procedure is done to define the gate structures 56. And in a preferred embodiment, a reactive ion etching (RIE) procedure is applied to define the gate structures 56 and first bumps 58. After the first etching procedure is done, the residual photoresist bumps 54 are completely removed.

Figure 4:
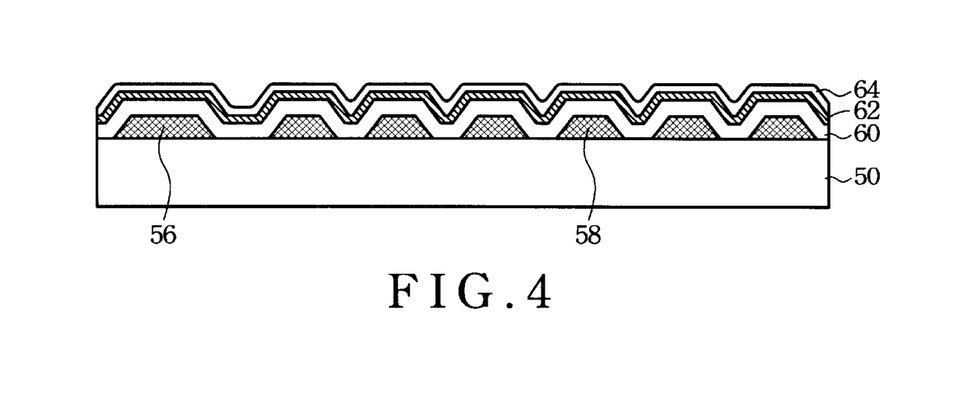
FIG. 4 is a cross sectional view of a transparent substrate illustrating the steps of forming the first insulating layer, the gate insulating layer, and the semiconductor layer sequentially in accordance with the present invention.

Next please refer to FIG. 4, a first insulating layer 60 is deposited on the gate structure 56, the first bumps 58, and the substrate 50. In general, the first insulating layer 60 can be chosen from the group of oxide, nitride, oxynitride, or other likes. In a preferred embodiment, the silicon oxide layer or the nitride layer can be formed by applying a plasma enhance chemical vapor deposition (PECVD) process. Then a gate insulating layer 62 and a semiconductor layer 64 are deposited on the first insulating layer 60 in sequence, wherein the gate insulating layer 62 is made of nitride or likes. And material such as amorphous silicon can be applied to form the semiconductor layer 64 for defining the channels of TFT devices latter.

Figure 5:
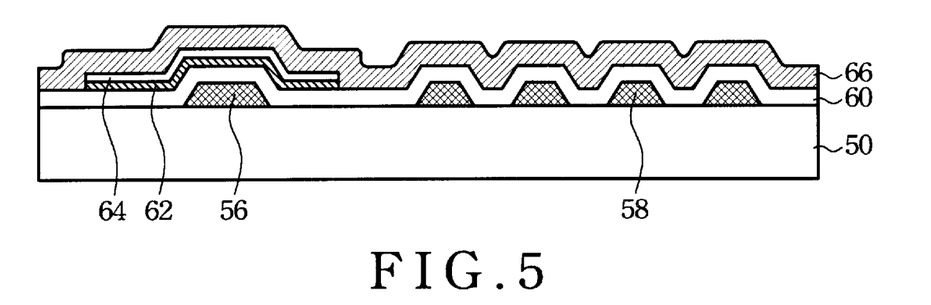
FIG. 5 is a cross sectional view of a transparent substrate illustrating the steps of defining the patterns of the semiconductor layer and depositing the second insulating layer in accordance with the present invention.
Figure 6:
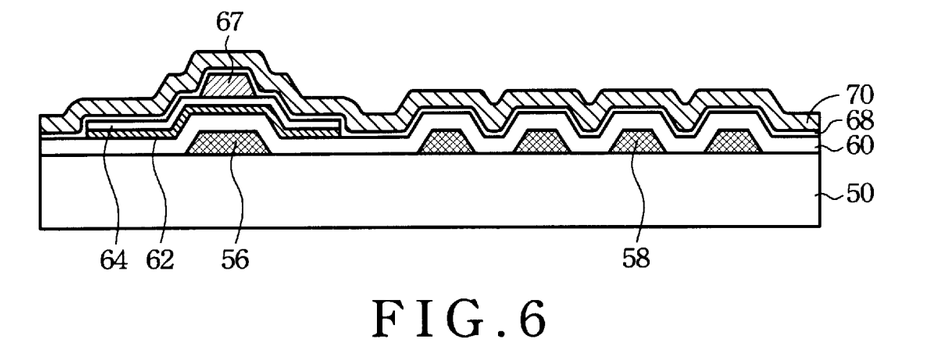
FIG. 6 is a cross sectional view of a transparent substrate illustrating the steps of defining the etching stopper and depositing the second metal layer in accordance with the present invention.

Then referring to FIG. 5, the semiconductor layer 64 and gate insulating layer 62 are etched to define a channel pattern above the gate structure 56 and to expose surfaces of the first insulating layer 60. Then a second insulating layer 66 is formed to cover the semiconductor layer 64 and the first insulating layer 60. And a second etching procedure is next performed to etch the second insulating layer 66 for defining an etching stopper 67 above the gate structure 56 and the semiconductor layer 64 as illustrated in FIG. 6. A doped silicon layer 68 and a second metal layer 70 are then formed on outer surfaces of the etching stopper 67, the semiconductor layer 64 and the first insulating layer 60.

Figure 7:
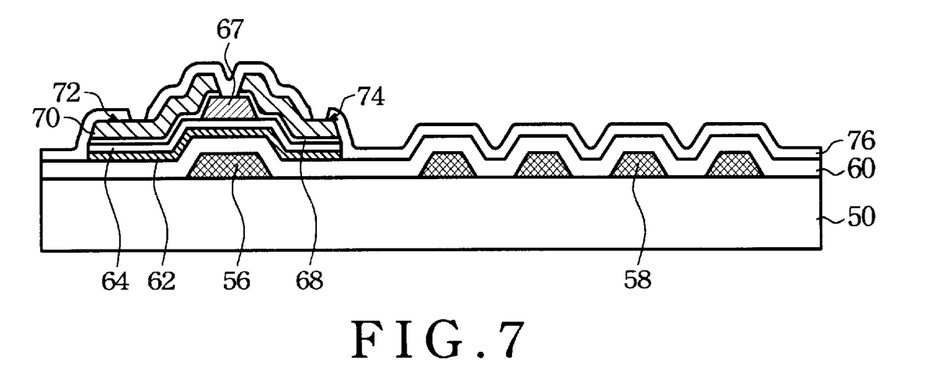
FIG. 7 is a cross sectional view of a transparent substrate illustrating the steps of defining the drain/source structures in accordance with the present invention.

Please refer to FIG. 7, a third etching procedure is performed to etch the second metal layer 70 and the doped silicon layer 68 for defining a source structure 72 and a drain structure 74 individually on the semiconductor layer 64 and aside the etching stopper 67. The etching stopper 67 is applied to prevent the semiconductor layer 64 from damage in the third etching procedure. After defining the source structure 72 and drain structure 74, a passivation layer 76 is formed on the substrate 50, and an etching step is done to expose portions of the source structure 72 and the drain structure 74 for electrical connection.

Figure 8:
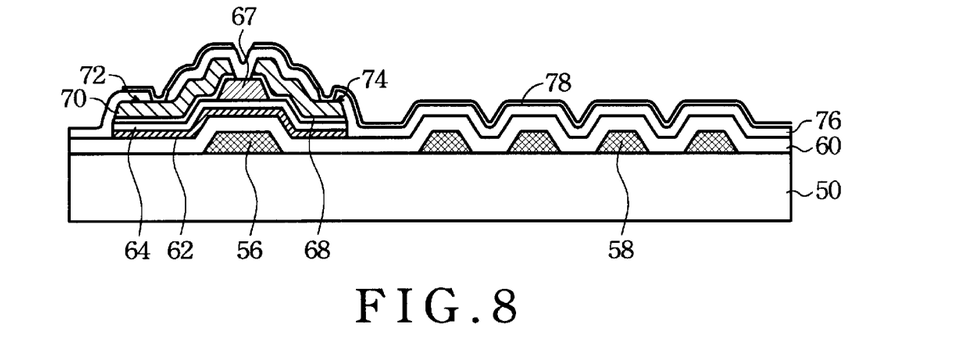
FIG. 8 is a cross sectional view of a transparent substrate illustrating the steps of forming the pixel electrode on the passivation layer in accordance with the present invention.

Refer to FIG. 8, a pixel electrode 78 is formed on the passivation layer 76 to electrical connecting the drain structure 74. The materials with higher reflectivity, such as metal, can be applied to form the pixel electrode 78 because the pixel electrode 78 is also applied to serve as a reflection member in reflective type TFT-LCD devices. In a preferred embodiment, the pixel electrode 78 is made of aluminum. Notedly, there are the plural first bumps 58 defined in the area of the pixel electrode 78 in the first etching procedure. Therefore the first insulating layer 60 and the passivation layer 76 formed above can duplicate the rough and uneven shapes of the bumps 58. Thus the pixel electrode 78 also has the rising and falling surfaces to serve as rough diffusers.

Figure 9:
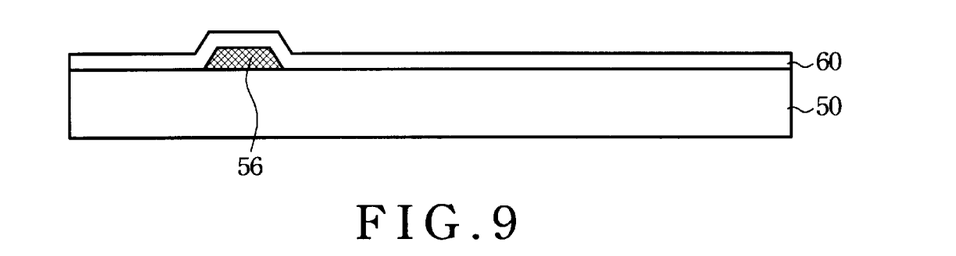
FIG. 9 is a cross sectional view of a transparent substrate illustrating the steps of defining the gate structure in accordance with the second embodiment of the present invention.

The Second Embodiment:

Refer to FIG. 9, similar to the above description, the first metal layer is formed on the transparent insulator substrate 50 and then is etched by performing the first etching procedure to define the gate structure 56 on the substrate 50. It is noted that no first bumps 58 (referring to FIG. 3) are defined in the area where are applied to define the pixel electrode latter in the first etching procedure of defining the first gate structure 56. Then the first insulating layer 60 is deposited on the gate structure 56 and the substrate 50. Similarly the first insulating layer 60 can be made of nitride or oxynitride.

Figure 10:
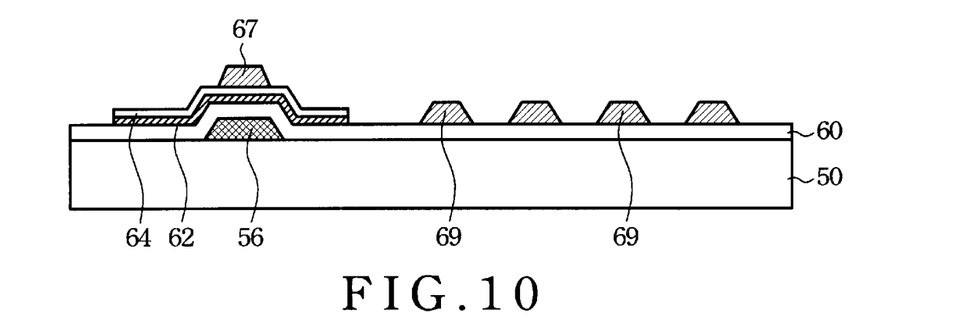
FIG. 10 is a cross sectional view of a transparent substrate illustrating the steps of defining the etching stopper and the plural second bumps simultaneously in accordance with the present invention.

Please refer to FIG. 10, the gate insulating layer 62 and the semiconductor layer 64 are next deposited on the first insulating layer 60 in sequence. And an etching step is done to define patterns of the semiconductor layer 64 above the gate structure 56. Then the second insulating layer is formed on the semiconductor layer 64 and the first insulating layer 60. And the second etching procedure is next performed to etch the second insulating layer for defining the etching stopper 67 above the gate structure 56 and simultaneously defining second bumps 69 on the first insulating layer 60 in the area for the pixel electrodes.

Figure 11:
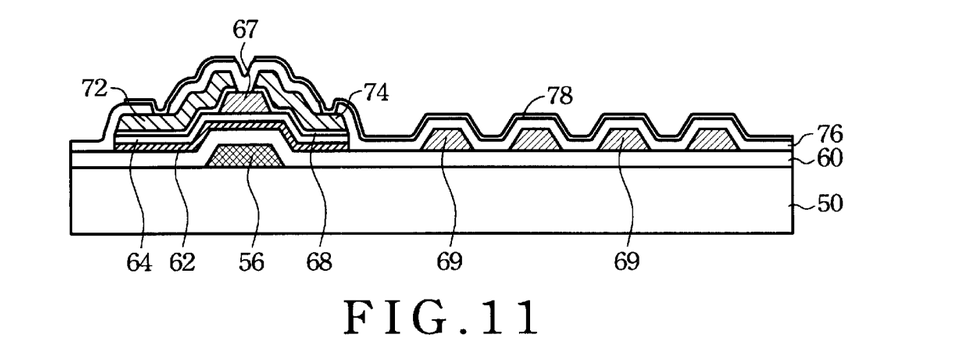
FIG. 11 is a cross sectional view of a transparent substrate illustrating the steps of forming the pixel electrode on the second bumps in accordance with the present invention.

Then refer to FIG. 11, as described above in the first embodiment, the doped silicon layer 68 and the second metal layer 70 are then formed above the substrate 50. And the third etching procedure is performed to define the source structure 72 and the drain structure 74 aside the etching stopper 67. The passivation layer 76 is subsequently formed on the thin-film transistor and the second bumps 69. And an etching step is done to expose portions of the source structure 72 and the drain structure 74. Then the pixel electrode 78 is formed on the passivation layer 76 to electrical connecting the drain structure 74. It is noted that the second bumps 69 are defined in the pixel electrode area simultaneously when the etching stopper 67 is defined in the second etching procedure. Therefore the passivation layer 76 formed above can duplicate the rough and uneven shapes from the second bumps 69. Thus the pixel electrode 78 deposited latter also has the rising and falling surface to serve as the rough diffuser.

Namely, in the first embodiment, the first bumps 58 are formed while the first metal layer is etched. Thus the pixel electrode 78 serving as the reflection member has the rough surface due to the shape duplication from the below layer. Relatively in the second embodiment, the second bumps 69 are formed in the meantime the second insulating layer 66 is etched, to make the pixel electrode 78 has the duplicated rough diffuser surface.

Surely the rough reflection surface can also be made by the etching procedure to define the second metal layer 70. For instance, after depositing the second metal layer 70 on the first insulating layer 60, the third etching procedure is performed to define above the drain structure 72 and the source structure 74, and to define simultaneously plural third bumps 71. Then the passivation layer 76 and the pixel electrode 78 deposited also can duplicate the rough outer shapes from the third bumps 71.

Obviously the thickness of the first bumps, the second bumps, and the third bumps, are limited by the first metal layer 52, the second insulating layer and the second metal layer 70 respectively. Namely in the practical process, the thickness of above bumps are restricted by the gate structure, the etching stopper, the drain structure individually. But the surface shape of the pixel electrode can still be controlled by adjusting the width of the above bumps. For example, the highly concentrated rough surface of pixel electrode can be obtained by shortening the interval between each two adjacent bumps and shortening the width of all bumps.

Besides, in the above embodiment, just one sort of bumps, such as the first bumps, the second bumps, or the third bumps, is applied to make the rough diffuser surface. However in the practical application, all sorts of bumps can be applied or stacked arbitrarily to form the desired rough reflection surface. Namely the three different types of bumps can be stacked up mutually to form various stack structures for making varied rough surface shapes of the pixel electrode. And higher step height of the stack structure can be obtained by applying the three sorts of bumps reciprocally stacked.

Figure 12A:
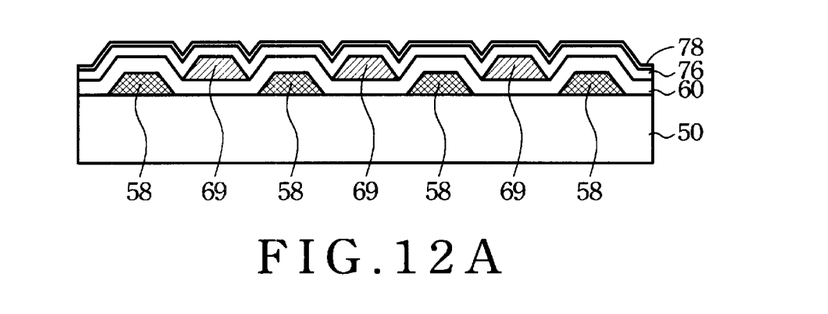
FIGS. 12A~L are cross sectional views of transparent substrates illustrating the rise and fall surfaces of the pixel electrodes caused by the stack structure which is stacked by applying the three sorts of the bumps in accordance with the present invention.

Please refer to FIGS. 12A~I, some stacks are illustrated. In FIG. 12A, the first metal layer 52 is etched to define the first bumps 58 on the substrate 50. After depositing the first insulating layer 60, the second etching procedure is done to define the patterns of the second insulating layer 66 and to define the second bumps 69, wherein each the second bump 69 is located within the interval of two adjacent the first bump 58. Then the rough and uneven surface of the pixel electrode 78 can be adjusted by applying the first bumps 58 and the second bumps 69 arbitrarily.

Figure 12B:
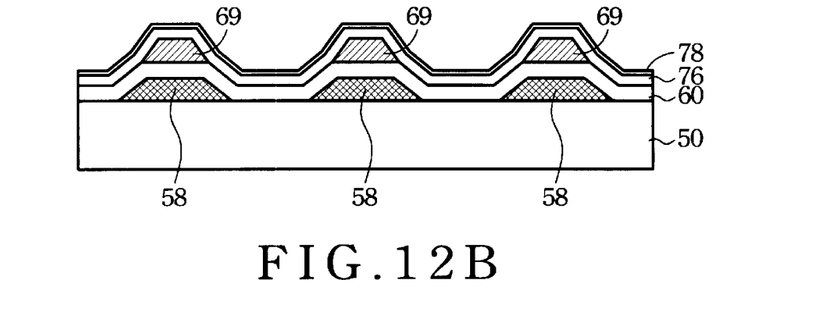
Figure 12C:
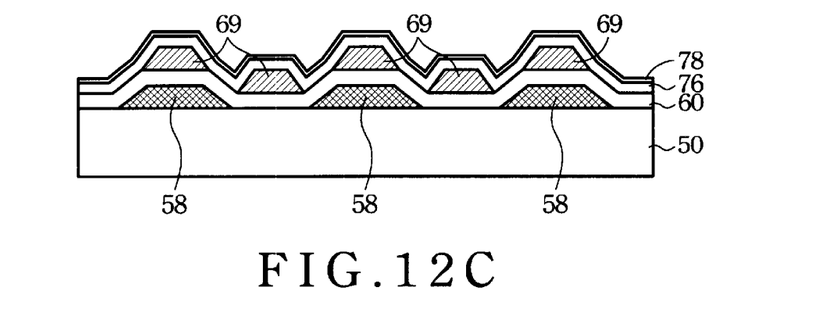
Figure 12D:
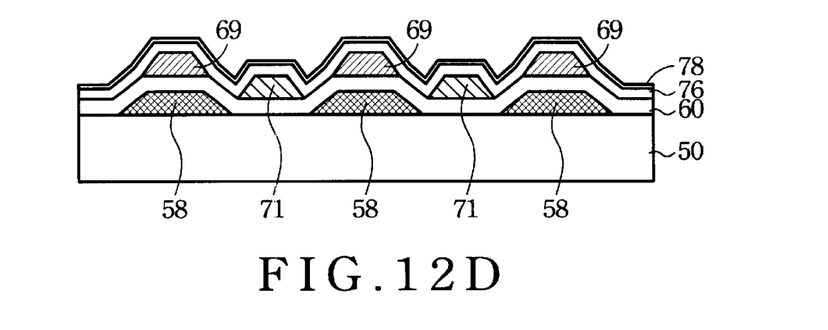

Similarly, the second bump 69 is defined just right on the first bump 58 to have the pixel electrode more roughly as shown in FIG. 12B. And in FIG. 12C, the closer and packed second bumps 69 are formed right on the first bumps 58 and in the interval of two adjacent the first bumps 58. In FIG. 12D, the first, second, third bumps are stacked in sequence, wherein the second bumps 69 are formed right on the first bumps 58, and each the third bump 71 is defined in the interval of two adjacent the second bumps 69.

Figure 12E:
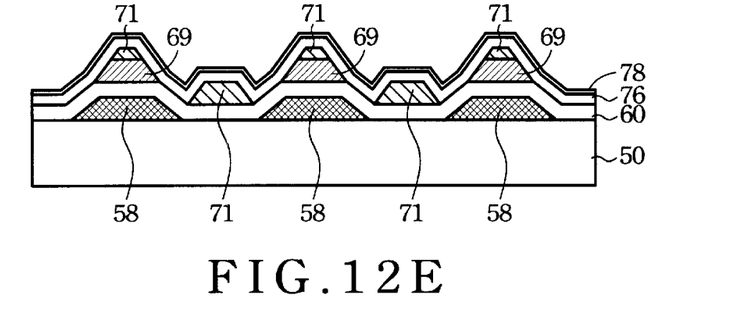
Figure 12F:
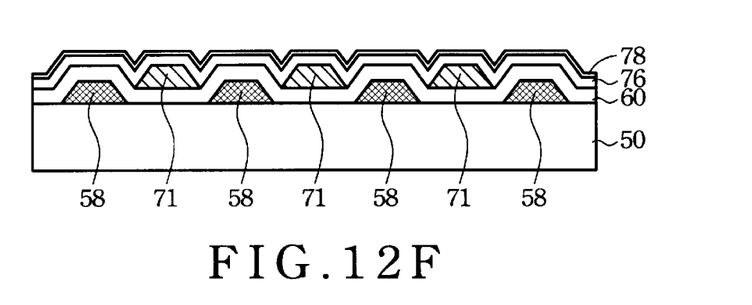
Figure 12G:
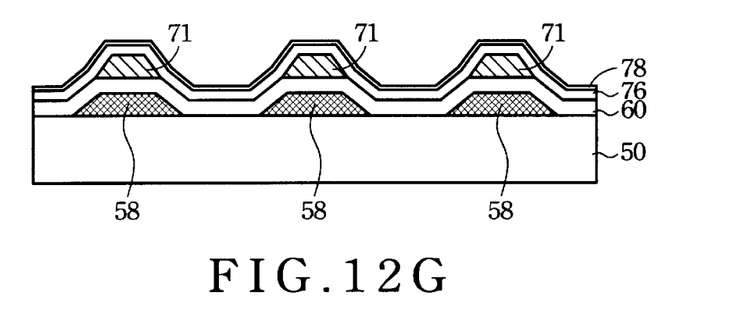
Figure 12H:
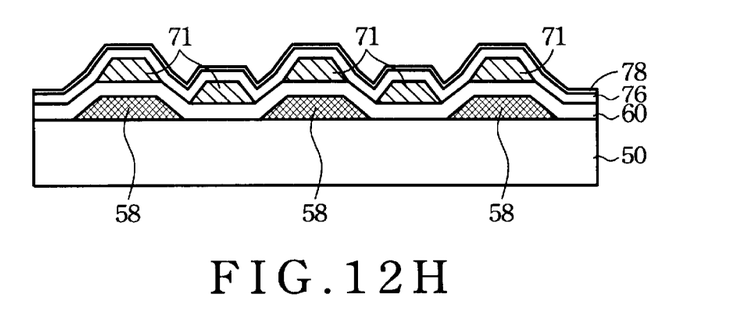
Figure 12I:
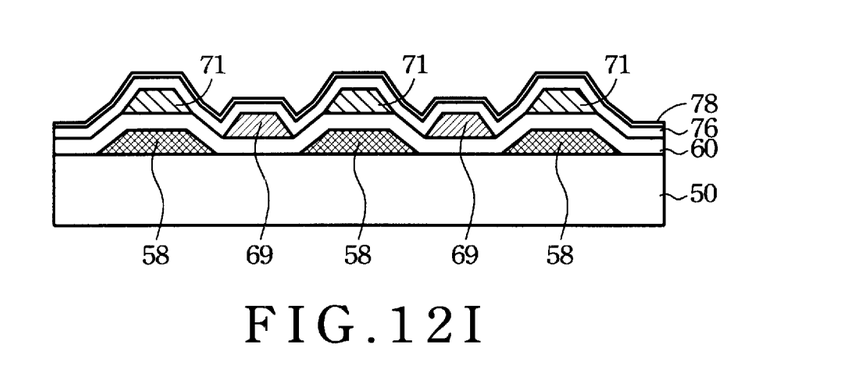

Further please refer to FIG. 12E, the second bumps 69 are formed on the first bumps 58. And then the third bumps 71 are defined individually right on the second bumps 69 and on the first insulating layer 60 between two adjacent the two bumps 69. Next refer to FIGS. 12F~H, the first bumps 58 and the third bumps 71 are applied to stack mutually arbitrarily to make the pixel electrode uneven. In FIGS. 12I and 12D, the second bumps 69 and the third bumps 71 are overlapped on the first bumps 58 to have the required rough reflection surface.

Figure 13:
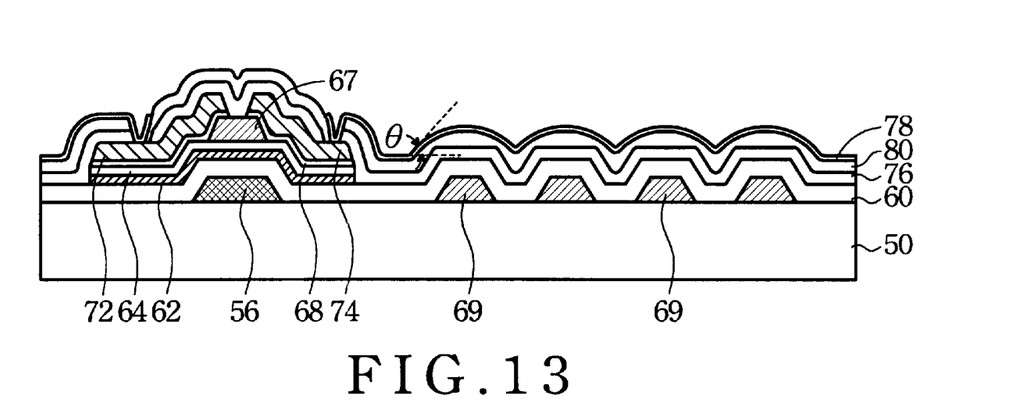
FIG. 13 is a cross sectional view of a transparent substrate illustrating the covering layer is applied to smooth and regular the angles of the rough surfaces of the pixel electrodes in accordance with the present invention.

Though various structures stacked by the three sorts of bumps 58, 69, and 71 arbitrarily to control the roughness of the pixel electrode, a covering layer can be applied before forming the pixel electrode to readjust the rising and falling surface for requirement. Refer to FIG. 13, after depositing the passivation layer 76, a covering layer 80 is coated onto the passivation layer 76, and then the pixel electrode 78 is formed. In the area A, the first bumps 58 formed of the first metal layer are defined on the substrate 50. Thus the first insulating layer 60 and the passivation layer 76 deposited latter can duplicate the surface shape upwards. And the covering layer 80 made of such as organic material can smooth the rising and falling surface and to adjust the angle θ of the uneven surface.

Figure 12J:
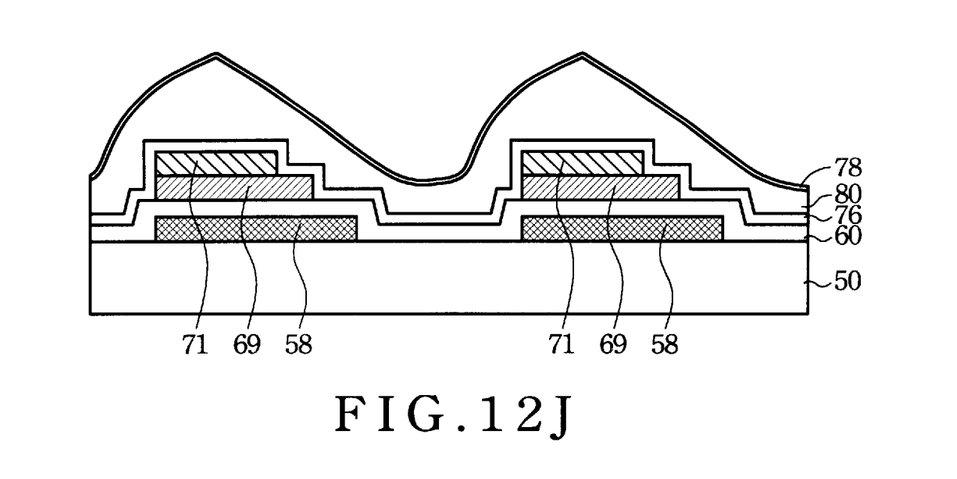
Figure 12K:
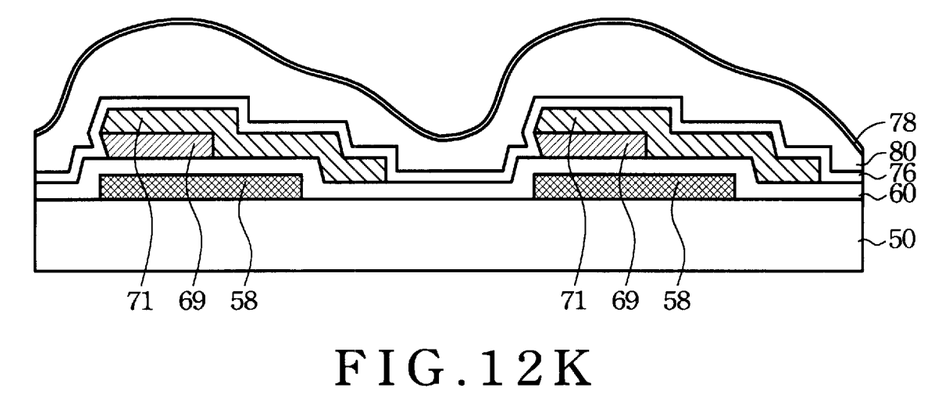
Figure 12L:
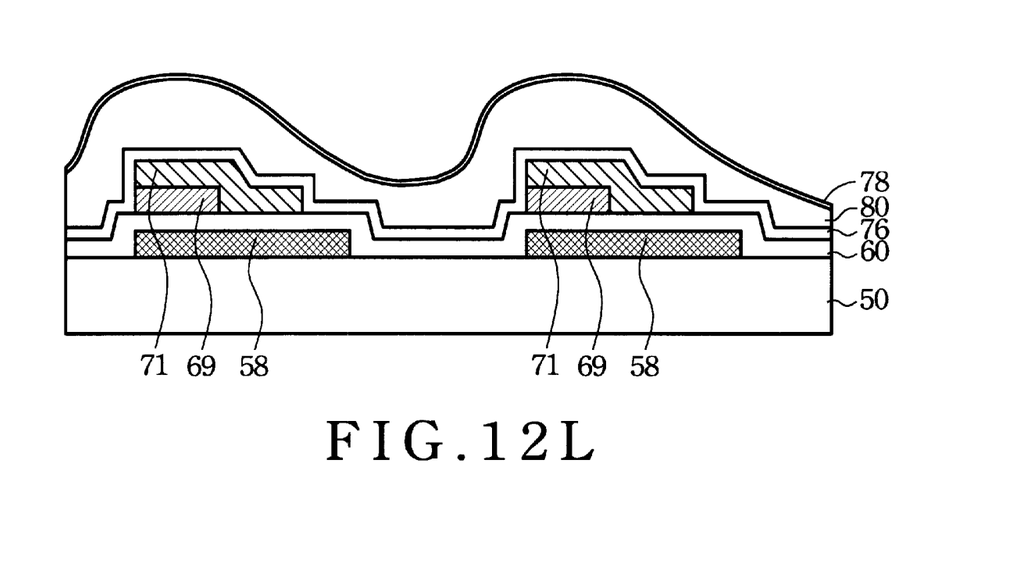

Please refer to FIGS. 12J, K, L, the three sorts of bumps 58, 69, 71 and the covering layer 80 are applied to make the required uneven surface. In FIG. 12J, the first bumps 58 are defined simultaneously when the first metal layer 52 is etched. And after depositing the first insulating layer 60, the second bumps 69 made of the second insulating layer 66 and the third bumps 71 made of the second metal layer 70 are defined sequentially right on the first bumps 58, wherein the third bumps 71 are right on the second bumps 69 and has a smaller size than that of the second bump 69. Similarly the size of the second bump 69 is smaller than that of the first bump 58. Accordingly an awl shaped stack as shown in these FIGUREs can be obtained. And the covering layer 80 formed on the awl stack can smooth and adjust the required surface of the pixel electrode 78.

Equally in FIG. 12K, dimensions of the first, second, third bumps 58, 69 and 71 are adjusted to construct various stacks. The third bump 71 with large size than the first bump 58 and the second bump 69 can cover completely the below second bump 69 and prolong to surfaces of the first insulating layer 60 for smoothing the rising and falling shapes. Thus after fabricating the covering layer 80 and the pixel electrode 78, the surface shape as shown in FIG. 12K can be obtained. And in FIG. 12L, the dimension of the third bump 71 is controlled between that of the first bump 58 and the third bump 71, so the third bump 71 can cover the whole second bump 69 and prolong to the surface of the first insulating layer 60.

The Third Embodiment (not Illustrated in FIGUREs)

The method mentioned in the first embodiment is applied to the process for forming the thin-film transistors with the etching stopper. However the feature of the present invention can also be applied to the BCE type TFT-LCD devices without the etching stopper. The difference of the first embodiment and the third embodiment is there is no the steps of forming the second insulating layer and performing the second etching procedure as described above.

Namely, in the third embodiment, it is not necessary to form the second insulating layer on the semiconductor layer and the first insulating layer. Therefore it is not necessary to perform the second etching procedure to defining the etching stopper. So there is no second bump defined as illustrated in the first embodiment. And only the first bumps and the third bumps can be applied in the third embodiment. However the rough surface of the pixel electrode still can be obtained by stacking the first bumps and the third bumps arbitrarily.

The present invention can provide various benefits. First, the first, second, and third bumps applied to make the pixel electrode rough are made of the first metal layer, the second insulating layer and the second metal layer individually by performing the requisite etching procedures of the process. Thus there is no need to apply additional photo reticle and etching procedure to deposit and define the photoresist bumps like prior art. Accordingly the throughput of the TFT-LCD manufacture can be maintained when the pixel electrode diffuser are fabricated by applying the present invention. Besides, the shapes and the angles of rising and falling of surfaces of the pixel electrodes can be controlled by applying the three sorts of bumps stacked arbitrarily and adjusting the dimensions, the interval distance of each one sort of bumps.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. For example, the etching stoppers are applied in the first and second embodiments of the description above to prevent the below semiconductor layer from etching damage. However the same structure and feature can also be applied to the back channel etching (BCE) type process to save one photomask for promoting the throughput in advance, as illustrated in the third embodiment. And only the bottom gate type thin-film transistor is illustrated above, but the feature can also be applied to the process for top gate type transistor.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a TFT-LCD device with a rough pixel electrode, the method comprises the following steps of:

forming a first metal layer on a substrate;

performing a first etching procedure to etch the first metal layer for defining a gate structure;

forming a first insulating layer on the gate structure and the substrate;

forming a semiconductor layer on the first insulating layer above the gate structure;

forming a silicon nitride layer on the semiconductor layer and the first insulating layer;

performing a second etching procedure to etch the silicon nitride layer to define an etching stopper above the gate structure;

forming a second metal layer on the first insulating layer, the etching stopper, and the semiconductor layer;

performing a third etching procedure to etch the second metal layer to define drain/source structures;

forming a passivation layer on the drain/source structures and the first insulating layer;

forming a pixel electrode on the passivation layer to electrically connect the drain/source structures;

wherein at least one sort of bumps are formed above the substrate to make the passivation layer and the pixel electrode duplicate rough and uneven surface shapes of the bumps, wherein the bumps comprise first bumps made of the first metal layer being defined in the first etching procedure simultaneously, second bumps made of the silicon nitride layer being defined in the second etching procedure simultaneously, and third bumps made of the second metal layer being defined in the third etching procedure simultaneously.

2. The method of claim 1, wherein the first metal layer is selected from the group consisting of Al, Cr, Ti, W, Ta, Mo, alloy and combination thereof.

3. The method of claim 1, wherein the second metal layer is selected from the group consisting of Al, Cr, Ti, W, Ta, Mo, alloy and combination thereof.

4. A method of forming a TFT-LCD device with a rough pixel electrode, the method comprises the following steps of:

forming a first metal layer on a substrate;

performing a first etching procedure to etch the first metal layer for defining a gate structure;

forming a first insulating layer on the gate structure and the substrate;

forming a semiconductor layer on the first insulating layer above the gate structure;

forming a second insulating layer on the semiconductor layer and the first insulating layer;

performing a second etching procedure to etch the second insulating layer to define an etching stopper above the gate structure;

forming a second metal layer on the etching stopper, the semiconductor layer, and the first insulating layer;

performing a third etching procedure to etch the second metal layer to define drain/source structures aside the etching stopper;

forming a passivation layer on the drain/source structures and the first insulating layer, wherein a portion of the drain/source structures is exposed;

forming a pixel electrode on the passivation layer to electrically connect the drain/source structures;

wherein at least one sort of bumps are defined above the substrate to make the passivation layer and the pixel electrode duplicate rising and falling shapes of the bumps, wherein the bumps comprise first bumps made of the first metal layer defined in the first etching procedure simultaneously, second bumps made of the second insulating layer defined in the second etching procedure simultaneously, and third bumps made of the second metal layer defined in the third etching procedure simultaneously.

5. The method of claim 4, wherein the first metal layer is selected from the group consisting of Al, Cr, Ti, W, Ta, Mo, alloy and combination thereof.

6. The method of claim 4, wherein the second metal layer is selected from the group consisting of Al, Cr, Ti, W, Ta, Mo, alloy and combination thereof.

7. The method of claim 4, wherein the first insulating layer is selected from the group consisting of silicon nitride, silicon oxide, silicon oxynitride, and composition thereof.

8. The method of claim 4, further comprises a step of depositing a doped silicon layer on the semiconductor layer and the etching stopper before depositing the second metal layer.

9. The method of claim 4, further comprises a step of forming a covering layer on the passivation layer to adjust angles of the rough pixel electrode after forming the passivation layer.

10. A method of forming a TFT-LCD device with a rough pixel electrode for serving as a diffuser, the method comprises the following steps of:

forming a first metal layer on a substrate;

performing a first etching procedure to etch the first metal layer for defining a gate structure and first bumps on the substrate;

forming a first insulating layer on the substrate to cover the gate structure and the first bumps;

forming a semiconductor layer on the first insulating layer above the gate structure;

forming a second insulating layer on the semiconductor layer and the first insulating layer;

performing a second etching procedure to etch the second insulating layer to define an etching stopper above the gate structure;

forming a second metal layer on the etching stopper, the semiconductor layer and the first insulating layer;

performing a third etching procedure to etch the second metal layer to define drain/source structures aside the etching stopper;

forming a passivation layer on the drain/source structures and the first insulating layer, wherein a portion of the drain/source structures is exposed; and forming a pixel electrode on the passivation layer to electrically connect the source structure, wherein the passivation layer and the pixel electrode with rough surface shapes duplicated from that of the first bumps.

11. The method of claim 10, further comprising a step of forming a covering layer on the passivation layer to adjust angles of the rough surface of the pixel electrode.

12. The method of claim 10, wherein the second etching procedure is applied to define second bumps made of the second insulating layer on the first insulating layer simultaneously.

13. The method of claim 10, wherein the third etching procedure is applied to define third bumps made of the second metal layer on the first insulating layer simultaneously.

* * * * *